US011860656B2

(12) United States Patent
Wang et al.

(10) Patent No.: US 11,860,656 B2
(45) Date of Patent: Jan. 2, 2024

(54) LOW-DROPOUT VOLTAGE REGULATOR

(71) Applicant: LITE-ON SINGAPORE PTE. LTD., Singapore (SG)

(72) Inventors: You-Fa Wang, Singapore (SG); Wei Shi, Singapore (SG); Darmayuda Imade, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 143 days.

(21) Appl. No.: 17/668,338

(22) Filed: Feb. 9, 2022

(65) Prior Publication Data

US 2023/0213953 A1 Jul. 6, 2023

(30) Foreign Application Priority Data

Jan. 5, 2022 (CN) ........................ 202210005160.X

(51) Int. Cl.
*G05F 1/46* (2006.01)

(52) U.S. Cl.
CPC .................................... *G05F 1/461* (2013.01)

(58) Field of Classification Search
CPC ........................................................ G05F 1/461
See application file for complete search history.

(56) References Cited

U.S. PATENT DOCUMENTS 6,707,340 B1 * 3/2004 Gough .................... H03F 1/083 323/280
8,970,188 B2 * 3/2015 Ganta ..................... G05F 1/575 323/273
2018/0294812 A1 * 10/2018 Tan ................ H03K 19/017536
2022/0365549 A1 * 11/2022 Delshadpour ....... H03F 3/45475

* cited by examiner

*Primary Examiner* — Jue Zhang
*Assistant Examiner* — Lakaisha Jackson
(74) *Attorney, Agent, or Firm* — Li & Cai Intellectual Property Office

(57) ABSTRACT

A low-dropout voltage regulator is provided. The low-dropout voltage regulator includes a differential amplifier pair, a secondary amplification circuit that is self-stabilized, an output circuit, and a frequency compensation circuit. The secondary amplification circuit includes a first amplification transistor and a second amplification transistor. The first amplification transistor includes a first terminal, a second terminal, and a third terminal. The second amplification transistor includes a first terminal, a second terminal, and a third terminal. The second terminal of the first amplification transistor is electrically connected to the second terminal of the second amplification transistor to form an input terminal of the secondary amplification circuit to be connected to an output terminal of the differential amplifier pair. The frequency compensation circuit is disposed between an output terminal of the secondary amplification circuit, a second terminal of an output transistor, and a third terminal of the output transistor.

10 Claims, 8 Drawing Sheets

LOW-DROPOUT VOLTAGE REGULATOR

CROSS-REFERENCE TO RELATED PATENT APPLICATION

This application claims the benefit of priority to China Patent Application No. 202210005160.X, filed on Jan. 5, 2022 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a low-dropout voltage regulator, and more particularly to a low-dropout voltage regulator having a simple structure.

BACKGROUND OF THE DISCLOSURE

Most of the conventional low-dropout voltage regulators require a compensation capacitor that has large impedance values or a compensation complex circuit.

How to provide a low-dropout voltage regulator that has a simple circuit structure to overcome the above-mentioned shortcoming has become an important issue in the industry.

SUMMARY OF THE DISCLOSURE

In response to the above-referenced technical inadequacy, the present disclosure provides a low-dropout voltage regulator.

The low-dropout voltage regulator includes a differential amplifier pair, a secondary amplification circuit that is self-stabilized, an output circuit, and a frequency compensation circuit. The differential amplifier pair includes an output terminal and a feedback terminal. The secondary amplification circuit that is self-stabilized includes an input terminal and an output terminal. The output terminal of the differential amplifier pair is electrically connected to the input terminal of the secondary amplification circuit that is self-stabilized. The secondary amplification circuit includes a first amplification transistor and a second amplification transistor. The secondary amplification circuit is self-stabilized, and does not require an additional compensation circuit such as a Miller compensation circuit to ensure a stability of a primary and the secondary amplification circuits. The first amplification transistor includes a first terminal, a second terminal, and a third terminal. The second amplification transistor includes a first terminal, a second terminal, and a third terminal. The first terminal of the first amplification transistor is electrically connected to an input voltage, VDD, which also acts as the power supplier of the differential amplifier pair, the secondary amplification circuit and the output circuit. The second terminal of the first amplification transistor is electrically connected to the second terminal of the second amplification transistor to form the input terminal of the secondary amplification circuit to be connected to the output terminal of the differential amplifier pair. The third terminal of the first amplification transistor is electrically connected to the first terminal of the second amplification transistor to form the output terminal of the self-stabilized secondary amplification circuit. The output circuit includes an output transistor and a feedback circuit. The output transistor includes a first terminal, a second terminal, and a third terminal. The first terminal of the output transistor is electrically connected to the input voltage, VDD. The second terminal of the output transistor is electrically connected to the output terminal of the secondary amplification circuit. The third terminal of the output transistor is electrically connected to the feedback circuit. The feedback is electrically connected to the feedback terminal of the differential amplifier pair. The frequency compensation circuit is disposed between the output terminal of the secondary amplification circuit, the second terminal of the output transistor, and the third terminal of the output transistor.

Therefore, the low-dropout voltage regulator of the present disclosure has a simple circuit, and an internal capacitor of the low-dropout voltage regulator is very small. The low-dropout voltage regulator can be self-stabilized, and it is not necessary to include a compensation capacitor. In addition, the low-dropout voltage regulator of the present disclosure further has a wide operation voltage and a small ripple voltage.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
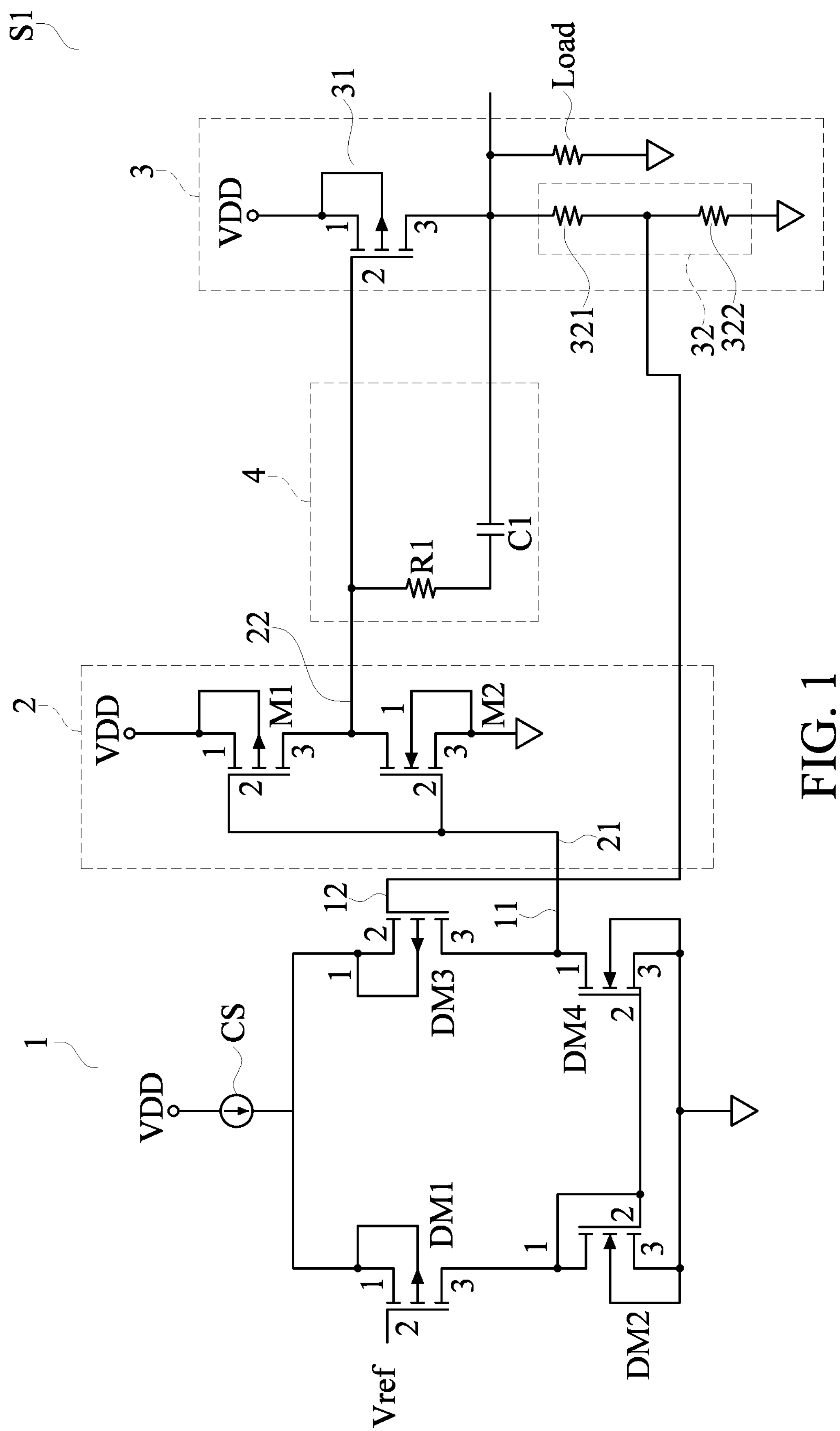
FIG. 1 is a schematic view of a low-dropout voltage regulator according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, FIG. 1 is a schematic view of a low-dropout voltage regulator according to a first embodiment of the present disclosure.

In this embodiment, a low-dropout voltage regulator S1 is provided. The low-dropout voltage regulator S1 includes a differential amplifier pair 1, a secondary amplification circuit 2, that is self-stabilized, an output circuit 3, and a frequency compensation circuit 4.

The differential amplifier pair 1 includes an output terminal 11 and a feedback terminal 12.

The secondary amplification circuit 2 includes an input terminal 21 and an output terminal 22. The output terminal 11 of the differential amplifier pair 1 is electrically connected to the input terminal 21 of the secondary amplification circuit 2. The secondary amplification circuit 2 includes a first amplification transistor M1 and a second amplification transistor M2. In this embodiment, the first amplification transistor M1 is a P-type metal-oxide-semiconductor field-effect transistor (MOSFET). The second amplification transistor M2 is an N-type metal-oxide-semiconductor field-effect transistor (MOSFET). The first amplification transistor M1 includes a first terminal, a second terminal, and a third terminal. The second amplification transistor M2 includes a first terminal, a second terminal, and a third terminal. The first terminal of the first amplification transistor M1 is electrically connected to an input voltage VDD. The second terminal of the first amplification transistor M1 is electrically connected to the second terminal of the second amplification transistor M2 to form the input terminal 21 of the secondary amplification circuit 2 to be connected to the input terminal 11 of the differential amplifier pair 1. The third terminal of the first amplification transistor M1 is connected to the first terminal of the second amplification transistor M2 to form the output terminal 22 of the secondary amplification circuit 2. In this embodiment, the first terminal of the first amplification transistor M1 is a source terminal. The second terminal of the first amplification transistor M1 is a gate terminal. The third terminal of the first amplification transistor M1 is a drain terminal. The first terminal of the second amplification transistor M2 is a drain terminal. The second terminal of the second amplification transistor M2 is a gate terminal. The third terminal of the second amplification transistor M2 is a source terminal. In this embodiment, the secondary amplification circuit 2 is a self-stabilization amplification circuit. In addition, a Miller compensation circuit is generally disposed between the differential amplifier pair and the secondary amplification circuit of the low-dropout voltage regulator. However, in this embodiment, the differential amplifier pair 1 and the secondary amplification circuit 2 are self-stabilized. In other words, a Miller compensation circuit is not required to be disposed between the differential amplifier pair 1 and the secondary amplification circuit 2.

The output circuit 3 includes an output transistor 31 and a feedback circuit 32. The output transistor 31 includes a first terminal, a second terminal, and a third terminal. The first terminal of the output transistor 31 is electrically connected to the input voltage VDD. The second terminal of the output transistor 31 is electrically connected to the output terminal 22 of the secondary amplification circuit 2. In this embodiment, the output circuit 3 can be connected to a loading component Load to provide an output voltage and an output current. In this embodiment, the output transistor 31 is a P-type metal-oxide-semiconductor field-effect transistor (MOSFET). The first terminal of the output transistor 31 is a source terminal. The second terminal of the output transistor 31 is a gate terminal. The third terminal of the output transistor 31 is a drain terminal.

The third terminal of the output transistor 31 is electrically connected to the feedback circuit 32. The feedback circuit 32 is connected to the feedback terminal 12 of the differential amplifier pair 1.

The frequency compensation circuit 4 is disposed between the output terminal 22 of the secondary amplification circuit 2, the second terminal of the output transistor 31, and the third terminal of the output transistor 31. In other words, the frequency compensation circuit 4 is disposed between the secondary amplification circuit 2 and the output circuit 3. In addition, the output terminal 11 of the differential amplifier pair 1 is directly connected to the second terminal of the first amplification transistor M1 and the second terminal of the second amplification transistor M2 of the secondary amplification circuit 2.

The frequency compensation circuit 4 includes a first compensation impedance R1 and a first compensation capacitor C1. The first compensation impedance R1 is serially connected to the first compensation capacitor C1. A resistance of the first compensation impedance R1 is between 200 ohm and 30000 ohm. A capacitance of the first compensation capacitor C1 is between 4 pF and 50 pF.

In this embodiment, the third terminal of the second amplification transistor M2 is electrically connected to a ground potential.

The differential amplifier pair 1 includes a current source CS, a first differential transistor DM1, a second differential transistor DM2, a third differential transistor DM3, and a fourth differential transistor DM4. In this embodiment, the first differential transistor DM1 and the third differential transistor DM3 are P-type metal-oxide-semiconductor field-effect transistors (MOSFET). The second differential transistor DM2 and the fourth differential transistor DM4 are N-type metal-oxide-semiconductor field-effect transistors (MOSFET).

The first differential transistor DM1 includes a first terminal, a second terminal, and a third terminal. The second differential transistor DM2 includes a first terminal, a second terminal, and a third terminal. The third differential transistor DM3 includes a first terminal, a second terminal, and a third terminal. The fourth differential transistor DM4 includes a first terminal, a second terminal, and a third terminal.

The first terminal of the first differential transistor DM1 and the first terminal of the third differential transistor DM3 are source terminals, respectively. The second terminal of the first differential transistor DM1 and the second terminal of the third differential transistor DM3 are gate terminals, respectively. The third terminal of the first differential transistor DM1 and the third terminal of the third differential transistor DM3 are drain terminals, respectively.

The first terminal of the second differential transistor DM2 and the first terminal of the fourth differential transistor DM4 are drain terminals, respectively. The second terminal of the second differential transistor DM2 and the second terminal of the fourth differential transistor DM4 are gate terminals, respectively. The third terminal of the second differential transistor DM2 and the third terminal of the fourth differential transistor DM4 are source terminals, respectively.

The current source CS is electrically connected to the first terminal of the first differential transistor DM1 and the first terminal of the third differential transistor DM3. The second terminal of the first differential transistor DM1 is electrically connected to a reference voltage Vref that is generally generated by a bandgap circuit. The third terminal of the first differential transistor DM1 is electrically connected to the first terminal of the second differential transistor DM2. The first terminal of the second differential transistor DM2 is electrically connected to the second terminal of the second differential transistor DM2. The second terminal of the second differential transistor DM2 is electrically connected to the second terminal of the fourth differential transistor DM4. The third terminal of the second differential transistor DM2 is electrically connected to a ground potential. The second terminal of the third differential transistor DM3 is set as the feedback terminal 12 of the differential amplifier pair 1. The feedback terminal 12 is electrically connected to the feedback circuit 32. The third terminal of the third differential transistor DM3 is electrically connected to the first terminal of the fourth differential transistor DM4 and the input terminal 21 of the secondary amplification circuit 2. The third terminal of the fourth differential transistor DM4 is electrically connected to the ground potential.

The feedback circuit 32 includes a first feedback impedance 321 and a second feedback impedance 322. The first feedback impedance 321 is serially connected to the second feedback impedance 322. A connection node between the first feedback impedance 321 and the second feedback impedance 322 is connected to the feedback terminal 12 of the differential amplifier pair 1.

The first amplification transistor M1 includes a first channel width. The second amplification transistor M2 includes a second channel width. The first channel width is ½ to ⅟15 of the second channel width.

In the embodiment, a variation of the output voltage of the output circuit 3 is provided to the secondary amplification circuit 2 through an amplification effect, and then the amplified voltage is provided to the output circuit 3 through the secondary amplification circuit 2 to effectively reduce the ripple voltage of the amplified voltage.

Second Embodiment

Figure 2:
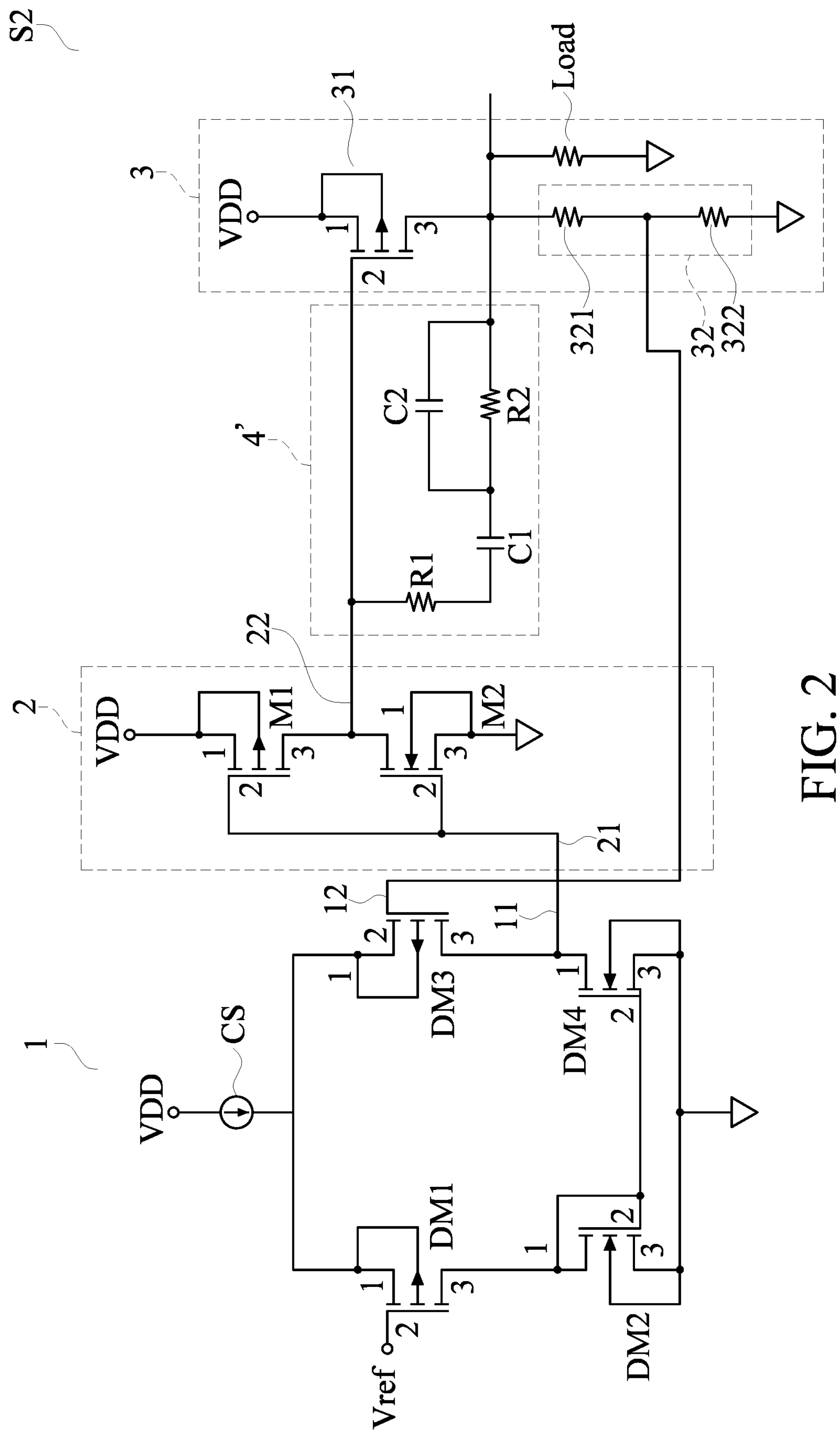
FIG. 2 is a schematic view of a low-dropout voltage regulator according to a second embodiment of the present disclosure.

Referring to FIG. 2, FIG. 2 is a schematic view of a low-dropout voltage regulator according to a second embodiment of the present disclosure.

In this embodiment, a low-dropout voltage regulator S2 is similar to the low-dropout voltage regulator S1, and the main difference between the second embodiment and the first embodiment is as follows:

A frequency compensation circuit 4' includes a first compensation impedance R1, a first compensation capacitor C1, a second compensation impedance R2, and a second compensation capacitor C2. The first compensation impedance R1 is serially connected to the first compensation capacitor C1. The second compensation impedance R2 is connected in parallel with the second compensation capacitor C2. The first compensation capacitor C1 is serially connected to the second compensation impedance R2 and the second compensation capacitor C2.

Third Embodiment

Figure 3:
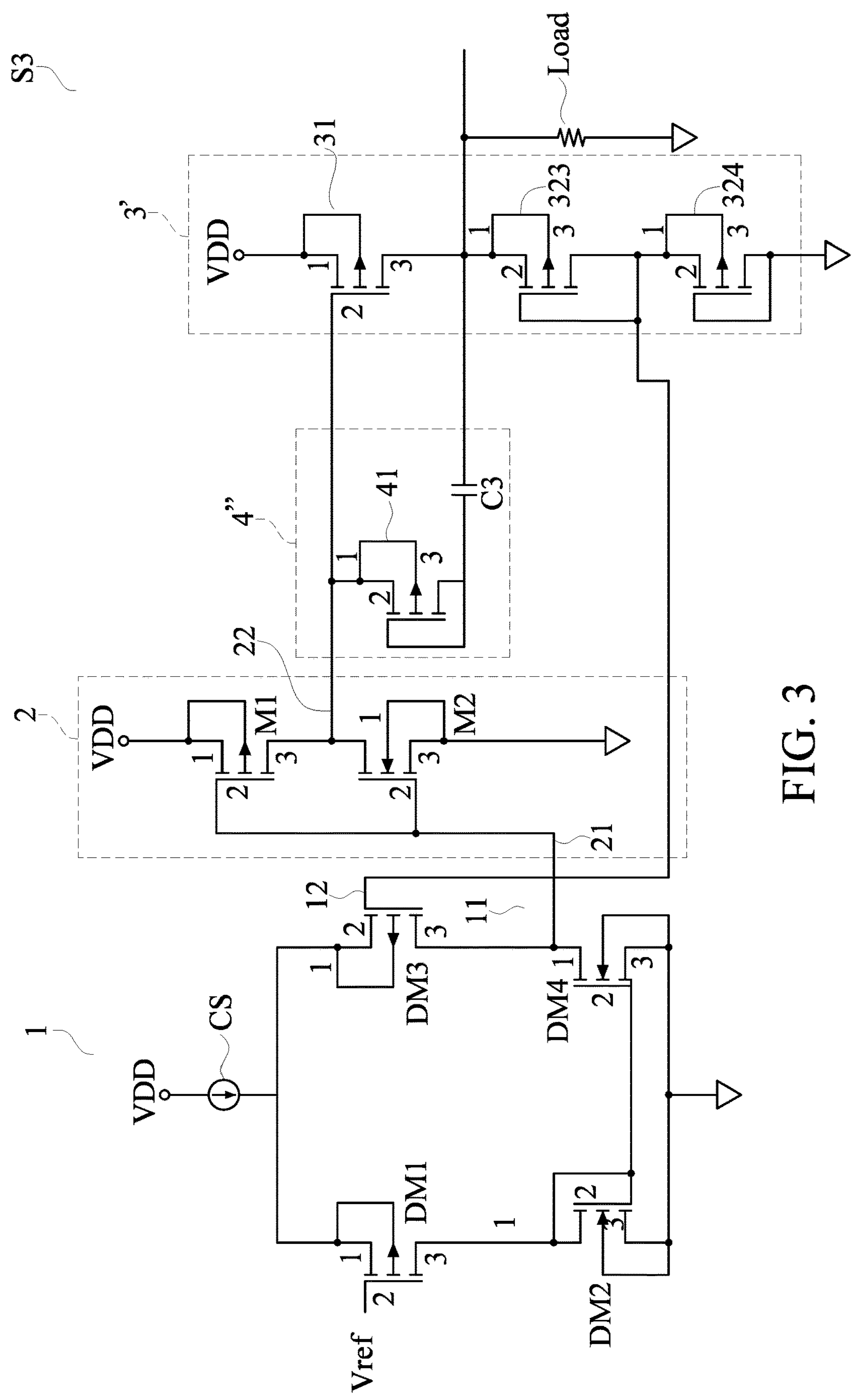
FIG. 3 is a schematic view of a low-dropout voltage regulator according to a third embodiment of the present disclosure.

Referring to FIG. 3, FIG. 3 is a schematic view of a low-dropout voltage regulator according to a third embodiment of the present disclosure.

In this embodiment, a low-dropout voltage regulator S3 is similar to the low-dropout voltage regulator S1 of the first embodiment, and the main difference between the third embodiment and the first embodiment is as follows:

A frequency compensation circuit 4" includes a compensation transistor 41 and a third compensation capacitor C3. The compensation transistor 41 includes a first terminal, a second terminal, and a third terminal. The first terminal of the compensation transistor 41 is electrically connected to the output terminal 22 of the secondary amplification circuit 2 and the second terminal of the output transistor 31. The second terminal of the compensation transistor 41 is electrically connected to the third terminal of the compensation transistor 41 and the third compensation capacitor C3. In this embodiment, the compensation transistor 41 is a P-type metal-oxide-semiconductor field-effect transistor (MOSFET). The first terminal of the compensation transistor 41 is a source terminal. The second terminal of the compensation transistor 41 is a gate terminal. The third terminal of the compensation transistor 41 is a drain terminal.

In addition, a feedback impedance of the feedback circuit 32 can be replaced by a first feedback transistor 323 and a second feedback transistor 324. The first feedback transistor 323 and the second feedback transistor 324 are P-type metal-oxide-semiconductor field-effect transistors (MOSFET).

Fourth Embodiment

Figure 4:
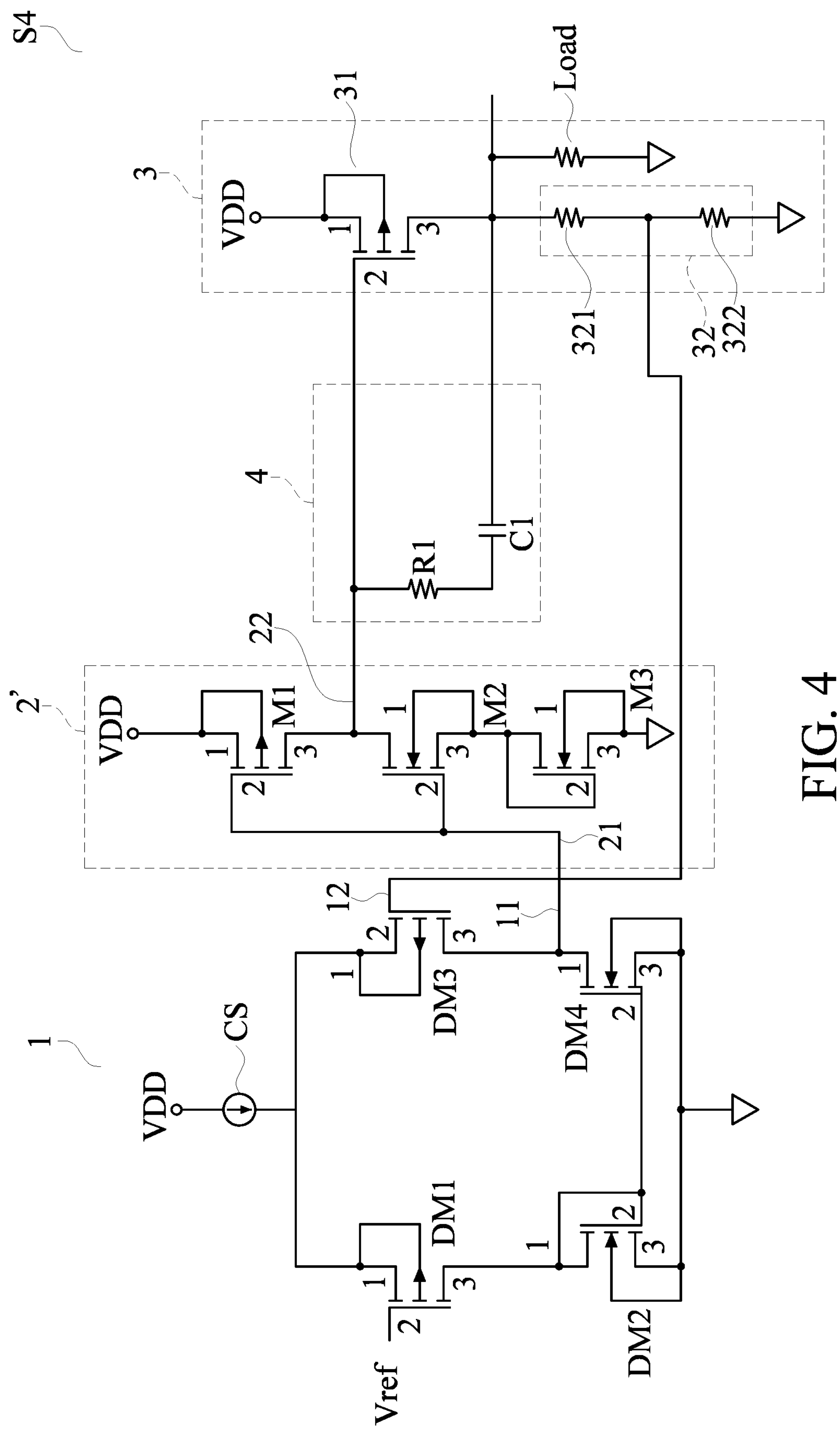
FIG. 4 is a schematic view of a low-dropout voltage regulator according to a fourth embodiment of the present disclosure.

Referring to FIG. 4, FIG. 4 is a schematic view of a low-dropout voltage regulator according to a fourth embodiment of the present disclosure.

In this embodiment, a low-dropout voltage regulator S4 is similar to the low-dropout voltage regulator S1 of the first embodiment, and the main difference between the fourth embodiment and the first embodiment is as follows:

A secondary amplification circuit 2' further includes a third amplification transistor M3. The third amplification transistor M3 includes a first terminal, a second terminal, and a third terminal. The first terminal of the third amplification transistor M3 is electrically connected to the third terminal of the second amplification transistor M2 and the second terminal of the third amplification transistor M3. The third terminal of the third amplification transistor M3 is electrically connected to a ground potential. The third amplification transistor M3 is an N-type metal-oxide-semiconductor field-effect transistor (MOSFET). The first terminal of the third amplification transistor M3 is a drain terminal. The second terminal of the third amplification transistor M3 is a gate terminal. The third terminal of the third amplification transistor M3 is a source terminal.

In this embodiment, the first amplification transistor M1 includes a first channel width. The second amplification transistor M2 includes a second channel width. The first channel width of the first amplification transistor M1 is ½ to ¹⁄₁₅ of the second channel width of the second amplification transistor M2.

In addition, the third amplification transistor M3 includes a third channel width. The third channel width of the third amplification transistor M3 is at least two times of the first channel width of the first amplification transistor M1.

Fifth Embodiment

Figure 5:
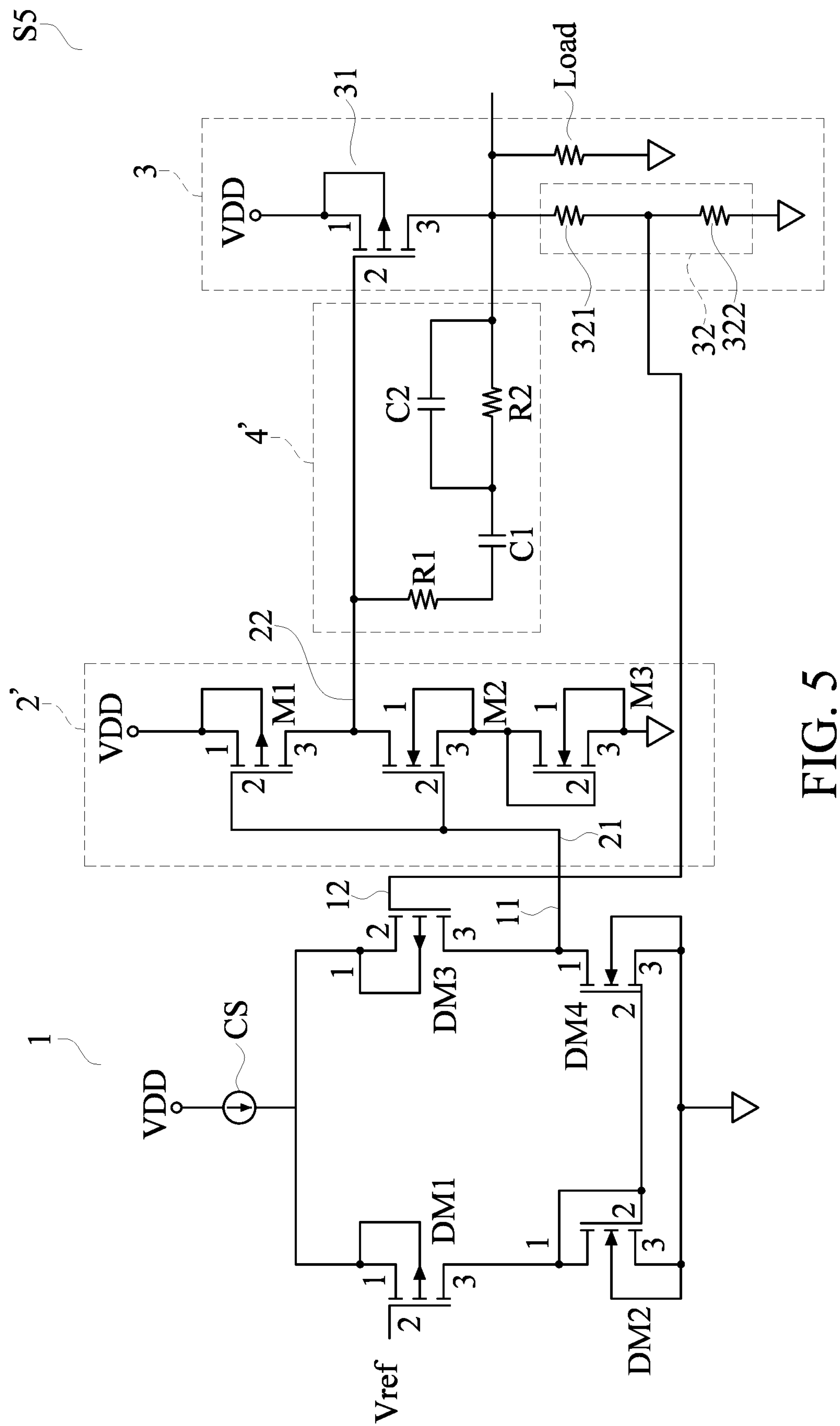
FIG. 5 is a schematic view of a low-dropout voltage regulator according to a fifth embodiment of the present disclosure.

Referring to FIG. 5, FIG. 5 is a schematic view of a low-dropout voltage regulator according to a fifth embodiment of the present disclosure.

In this embodiment, a low-dropout voltage regulator S5 is similar to the low-dropout voltage regulator S2 of the second embodiment, and the main difference between the fifth embodiment and the second embodiment is as follows:

A secondary amplification circuit 2' further includes a third amplification transistor M3. The third amplification transistor M3 includes a first terminal, a second terminal, and a third terminal. The first terminal of the third amplification transistor M3 is electrically connected to the third terminal of the second amplification transistor M2 and the second terminal of the third amplification transistor M3. The third terminal of the third amplification transistor M3 is electrically connected to a ground potential. The third amplification transistor M3 is an N-type metal-oxide-semiconductor field-effect transistor (MOSFET).

In this embodiment, the first amplification transistor M1 includes a first channel width. The second amplification transistor M2 includes a second channel width. The first channel width of the first amplification transistor M1 is ½ to ¹⁄₁₅ of the second channel width of the second amplification transistor M2.

In addition, the third amplification transistor M3 includes a third channel width. The third channel width of the third amplification transistor M3 is at least two times of the first channel width of the first amplification transistor M1.

Sixth Embodiment

Figure 6:
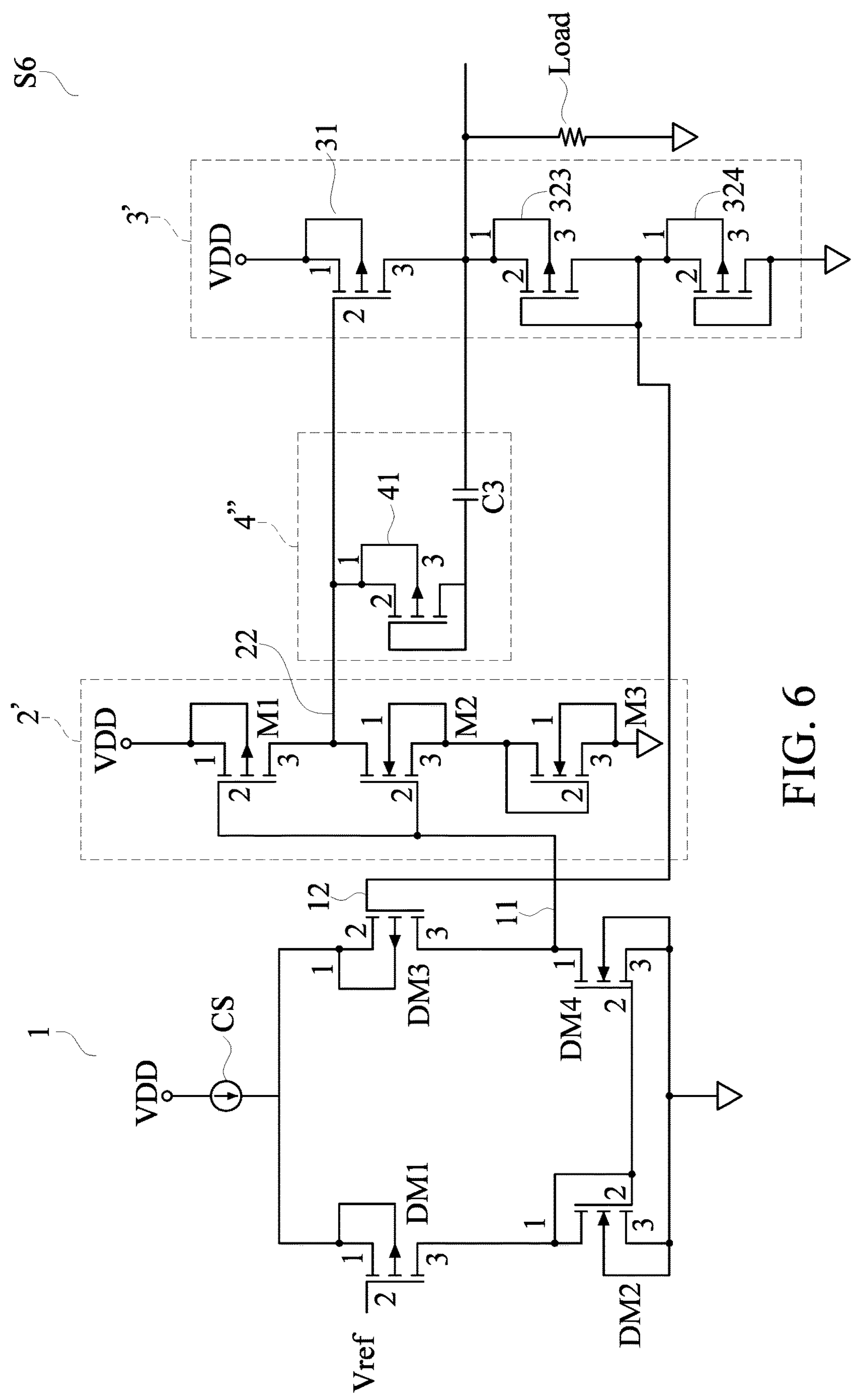
FIG. 6 is a schematic view of a low-dropout voltage regulator according to a sixth embodiment of the present disclosure.

Referring to FIG. 6, FIG. 6 is a schematic view of a low-dropout voltage regulator according to a sixth embodiment of the present disclosure.

In this embodiment, a low-dropout voltage regulator S6 is similar to the low-dropout voltage regulator S3 of the third embodiment, and the main difference between the sixth embodiment and the third embodiment is as follows:

A secondary amplification circuit 2' further includes a third amplification transistor M3. The third amplification transistor M3 includes a first terminal, a second terminal, and a third terminal. The first terminal of the third amplification transistor M3 is electrically connected to the third terminal of the second amplification transistor M2 and the second terminal of the third amplification transistor M3. The third terminal of the third amplification transistor M3 is electrically connected to a ground potential.

In this embodiment, the first amplification transistor M1 includes a first channel width. The second amplification transistor M2 includes a second channel width. The first channel width of the first amplification transistor M1 is ½ to ¹⁄₁₅ of the second channel width of the second amplification transistor M2.

In addition, the third amplification transistor M3 includes a third channel width. The third channel width of the third amplification transistor M3 is at least two times of the first channel width of the first amplification transistor M1.

In addition, a feedback impedance of the feedback circuit 32 of the output circuit 3 of the first embodiment and the fourth embodiment can be replaced by a first feedback transistor 323 and a second feedback transistor 324 of an output circuit 3' as shown in FIG. 3 and FIG. 6. In other words, the first feedback impedance R1 and the second feedback impedance R2 can be a resistor or a diode-connected metal-oxide-semiconductor field-effect transistor (MOSFET).

Figure 7:
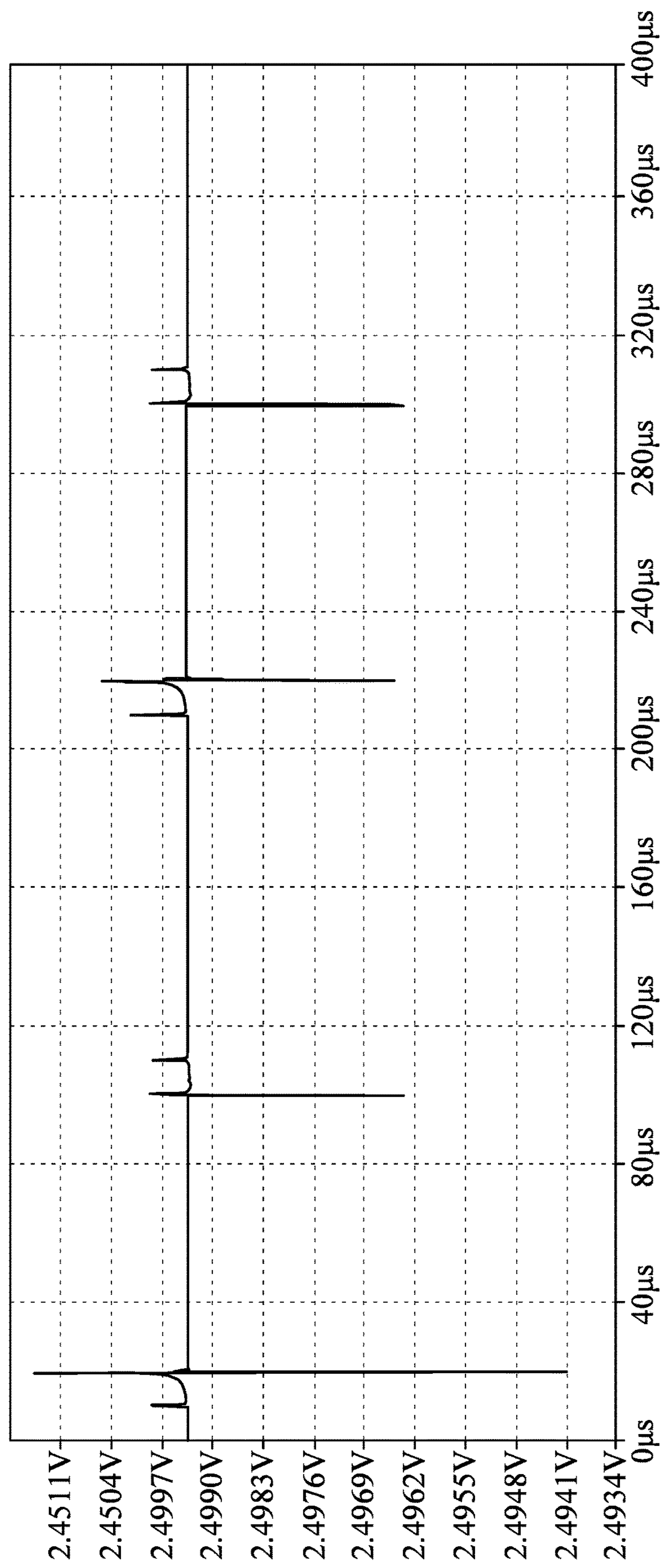
FIG. 7 is a schematic view of an output voltage of the low-dropout voltage regulator of the present disclosure.
Figure 8:
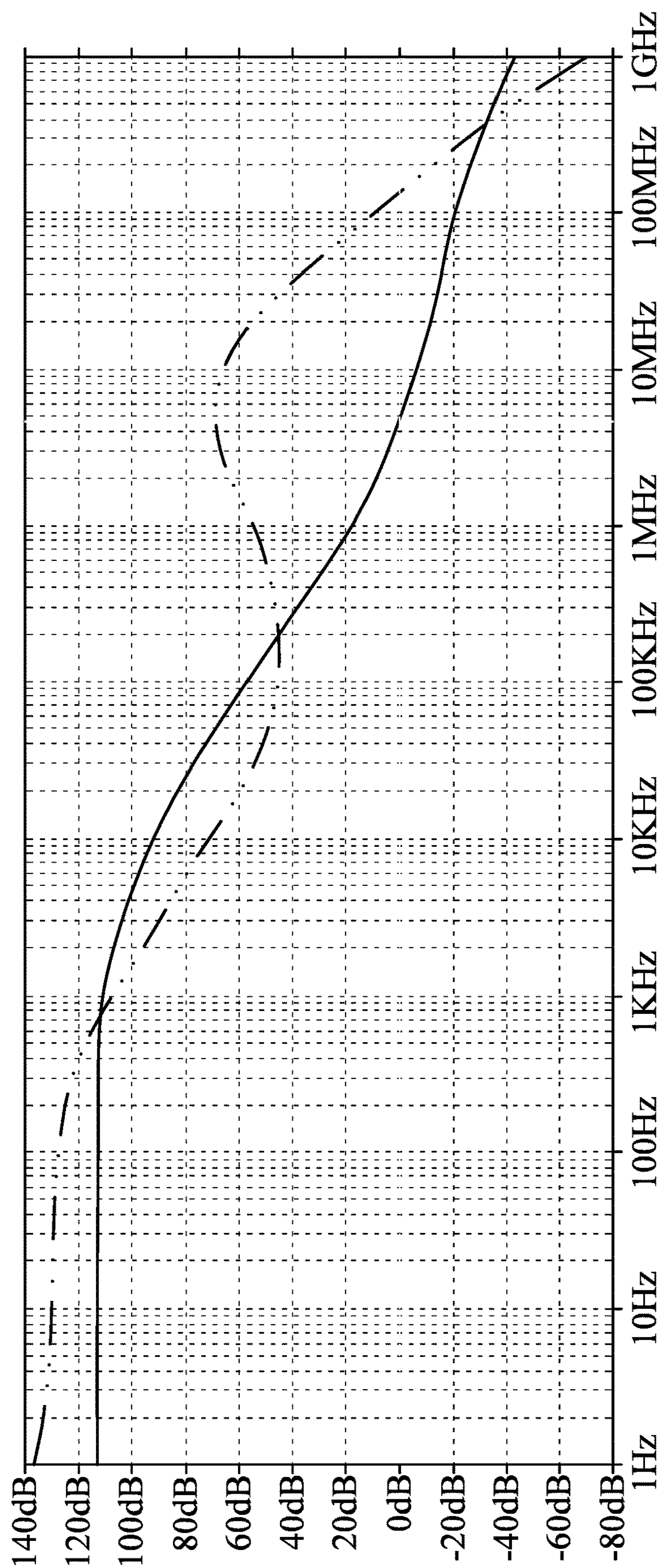
FIG. 8 is a schematic view of a phase and a gain of the low-dropout voltage regulator of the present disclosure.

Referring to FIG. 7 and FIG. 8, FIG. 7 is a schematic view of an output voltage of the low-dropout voltage regulator of the present disclosure. FIG. 8 is a schematic view of a phase and a gain of the low-dropout voltage regulator of the present disclosure.

In FIG. 7, the ripple voltage of the output voltage can be less than 10 mV. In FIG. 8, a phase margin is 57 degrees. The line regulation (LNR) of the low-dropout voltage regulator is 0.16 mV/V. A power supply rejection ratio is −71 dB. An efficiency of power supply rejection ratio is 83%.

Beneficial Effects of the Embodiments

In conclusion, the low-dropout voltage regulator of the present disclosure has a simple circuit, and an internal capacitor of the low-dropout voltage regulator is very small. The low-dropout voltage regulator can be self-stabilized, and it is not necessary to include an external compensation capacitor. In addition, the low-dropout voltage regulator of the present disclosure further has a wide operation voltage and a small ripple voltage.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A low-dropout voltage regulator, comprising:

a differential amplifier pair including an output terminal and a feedback terminal;

a secondary amplification circuit that is self-stabilized including an input terminal and an output terminal, wherein the output terminal of the differential amplifier pair is electrically connected to the input terminal of the secondary amplification circuit that is self-stabilized, wherein the secondary amplification circuit includes a first amplification transistor and a second amplification transistor, wherein the first amplification transistor includes a first terminal, a second terminal, and a third terminal, and the second amplification transistor includes a first terminal, a second terminal, and a third terminal, wherein the first terminal of the first amplification transistor is electrically connected to an input voltage, wherein the second terminal of the first amplification transistor is electrically connected to the second terminal of the second amplification transistor to form the input terminal of the secondary amplification circuit to be connected to the output terminal of the differential amplifier pair, wherein the third terminal of the first amplification transistor is electrically connected to the first terminal of the second amplification transistor to form the output terminal of the secondary amplification circuit that is self-stabilized;

an output circuit including an output transistor and a feedback circuit, wherein the output transistor includes a first terminal, a second terminal, and a third terminal, wherein the first terminal of the output transistor is electrically connected to the input voltage, the second terminal of the output transistor being electrically connected to the output terminal of the secondary amplification circuit, the third terminal of the output transistor being electrically connected to the feedback circuit, and the feedback circuit is electrically connected to the feedback terminal of the differential amplifier pair; and a frequency compensation circuit disposed between the output terminal of the secondary amplification circuit, the second terminal of the output transistor, and the third terminal of the output transistor.

2. The low-dropout voltage regulator according to claim 1, wherein the frequency compensation circuit includes a first compensation impedance and a first compensation capacitor, wherein the first compensation impedance is serially connected to the first compensation capacitor, an impedance value of the first compensation impedance is between 200 ohm and 30000 ohm, and a capacitance value of the first compensation capacitor is between 4 pF and 50 pF.

3. The low-dropout voltage regulator according to claim 1, wherein the frequency compensation circuit includes a first compensation impedance, a first compensation capacitor, a second compensation impedance, and a second compensation capacitor, wherein the first compensation impedance is serially connected to the first compensation capacitor, the second compensation impedance is connected in parallel with the second compensation capacitor, and the first compensation capacitor is serially connected to the second compensation impedance and the second compensation capacitor.

4. The low-dropout voltage regulator according to claim 1, wherein the frequency compensation circuit includes a compensation transistor and a third compensation capacitor, wherein the compensation transistor includes a first terminal, a second terminal, and a third terminal, wherein the first terminal of the compensation transistor is electrically connected to the output terminal of the secondary amplification circuit and the second terminal of the output transistor, and the second terminal of the compensation transistor is electrically connected to the third terminal of the compensation transistor and the third compensation capacitor.

5. The low-dropout voltage regulator according to claim 1, wherein the third terminal of the second amplification transistor of the secondary amplification circuit is electrically connected to a ground potential.

6. The low-dropout voltage regulator according to claim 1, wherein the secondary amplification circuit further includes a third amplification transistor, wherein the third amplification transistor includes a first terminal, a second terminal, and a third terminal, wherein the first terminal of the third amplification transistor is electrically connected to the third terminal of the second amplification transistor and the second terminal of the third amplification transistor, and the third terminal of the third amplification transistor is electrically connected to a ground potential.

7. The low-dropout voltage regulator according to claim 6, wherein the first amplification transistor includes a first channel width, and the second amplification transistor includes a second channel width, wherein the first channel width is ½ to ¹⁄₁₅ of the second channel width, wherein the third amplification transistor includes a third channel width, and the third channel width is at least two times of the first channel width.

8. The low-dropout voltage regulator according to claim 1, wherein the differential amplifier pair includes a current source, a first differential transistor, a second differential transistor, a third differential transistor, and a fourth differential transistor, wherein the first differential transistor includes a first terminal, a second terminal, and a third terminal, wherein the second differential transistor includes a first terminal, a second terminal, and a third terminal, wherein the third differential transistor includes a first terminal, a second terminal, and a third terminal, wherein the fourth differential transistor includes a first terminal, a second terminal, and a third terminal, wherein the current source is electrically connected to the first terminal of the first differential transistor and the first terminal of the third differential transistor, the second terminal of the first differential transistor is electrically connected to a reference voltage, and the third terminal of the first differential transistor is electrically connected to the first terminal of the second differential transistor, wherein the first terminal of the second differential transistor is electrically connected to the second terminal of the second differential transistor, the second terminal of the second differential transistor is electrically connected to the second terminal of the fourth differential transistor, and the third terminal of the second differential transistor is electrically connected to a ground potential, wherein the second terminal of the third differential transistor is set as the feedback terminal of the differential amplifier pair and is electrically connected to the feedback circuit, the third terminal of the third differential transistor is electrically connected to the first terminal of the fourth differential transistor and the input terminal of the secondary amplification circuit, and the third terminal of the fourth differential transistor is electrically connected to the ground potential.

9. The low-dropout voltage regulator according to claim 1, wherein the feedback circuit includes a first feedback impedance and a second impedance, the first feedback impedance and the second feedback impedance are resistors or diode-connected metal-oxide-semiconductor field-effect transistors (MOSFET), the first differential transistor and the third differential transistor are P-type metal-oxide-semiconductor field-effect transistors (MOSFET), and the second differential transistor and the fourth differential transistor are N-type metal-oxide-semiconductor field-effect transistors (MOSFET).

10. The low-dropout voltage regulator according to claim 1, wherein the first amplification transistor is a P-type metal-oxide-semiconductor field-effect transistor (MOSFET), the second amplification transistor is an N-type metal-oxide-semiconductor field-effect transistor (MOSFET), an amplifier circuit that includes the differential amplifier pair and the secondary amplification circuit is self-stabilized, and a compensation circuit is not disposed between the differential amplifier pair and the secondary amplification circuit.

* * * * *